United States Patent
Kubota et al.

(10) Patent No.: US 10,280,347 B2
(45) Date of Patent: *May 7, 2019

(54) SEMICONDUCTOR DEVICE MANUFACTURING METHOD AND UNDERFILL FILM

(71) Applicant: DEXERIALS CORPORATION, Tokyo (JP)

(72) Inventors: Kenji Kubota, Tochigi (JP); Takayuki Saito, Tochigi (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/532,931

(22) PCT Filed: Feb. 5, 2016

(86) PCT No.: PCT/JP2016/053462
§ 371 (c)(1),
(2) Date: Jun. 2, 2017

(87) PCT Pub. No.: WO2016/125881
PCT Pub. Date: Aug. 11, 2016

(65) Prior Publication Data
US 2018/0079939 A1 Mar. 22, 2018

(30) Foreign Application Priority Data

Feb. 6, 2015 (JP) .................................. 2015-022672

(51) Int. Cl.
C09J 163/08 (2006.01)
C09J 7/00 (2018.01)
(Continued)

(52) U.S. Cl.
CPC ............. *C09J 163/08* (2013.01); *C08G 59/42* (2013.01); *C09J 7/00* (2013.01); *C09J 133/04* (2013.01);
(Continued)

(58) Field of Classification Search
CPC ...................................................... H01L 21/563
See application file for complete search history.

(56) References Cited

U.S. PATENT DOCUMENTS 5,965,663 A * 10/1999 Hayase .................. C08G 75/23
524/609
9,721,921 B2 * 8/2017 Kim ........................ H01L 24/97
(Continued)

FOREIGN PATENT DOCUMENTS

JP 2002-252254 A 9/2002
JP 2005-028734 A 2/2005
(Continued)

OTHER PUBLICATIONS

Mar. 15, 2016 Search Report issued in International Patent Application No. PCT/JP2016/053462.

*Primary Examiner* — William A Harriston
(74) *Attorney, Agent, or Firm* — Oliff PLC

(57) ABSTRACT

A method for manufacturing a semiconductor device and an underfill film which can achieve voidless mounting and excellent solder bonding properties even in the case of collectively bonding a plurality of semiconductor chips are provided. The method includes a mounting step of mounting a plurality of semiconductor chips having a solder-tipped electrode onto an electronic component having a counter electrode opposing the solder-tipped electrode via an underfill film; and a compression bonding step of collectively bonding the plurality of semiconductor chips to the electronic component via the underfill film. The underfill film contains an epoxy resin, an acid anhydride, an acrylic resin,
(Continued)

and an organic peroxide and has a minimum melt viscosity of 1,000 to 2,000 Pa*s and a melt viscosity gradient of 900 to 3,100 Pa*s/° C. from a temperature 10° C. higher than a minimum melt viscosity attainment temperature to a temperature 10° C. higher than the temperature.

20 Claims, 11 Drawing Sheets

(51) Int. Cl.
- *C09J 133/04* (2006.01)
- *H01L 23/00* (2006.01)
- *C09J 133/16* (2006.01)
- *H01L 21/56* (2006.01)
- *H01L 23/29* (2006.01)
- *H01L 23/31* (2006.01)
- *C08G 59/42* (2006.01)
- *C09J 163/00* (2006.01)
- *H01L 25/065* (2006.01)
- *H01L 25/00* (2006.01)

(52) U.S. Cl.
CPC ............ *C09J 133/16* (2013.01); *C09J 163/00* (2013.01); *H01L 21/563* (2013.01); *H01L 23/293* (2013.01); *H01L 23/3157* (2013.01); *H01L 24/16* (2013.01); *H01L 24/81* (2013.01); *H01L 24/97* (2013.01); *C09J 2203/326* (2013.01); *C09J 2433/00* (2013.01); *C09J 2463/00* (2013.01); *H01L 25/0657* (2013.01); *H01L 25/50* (2013.01); *H01L 2224/16148* (2013.01); *H01L 2224/16238* (2013.01); *H01L 2224/32145* (2013.01); *H01L 2224/32225* (2013.01); *H01L 2224/73104* (2013.01); *H01L 2224/73204* (2013.01); *H01L 2224/81005* (2013.01); *H01L 2224/81203* (2013.01); *H01L 2224/83191* (2013.01); *H01L 2224/83192* (2013.01); *H01L 2225/06513* (2013.01); *H01L 2225/06568* (2013.01); *H01L 2924/0665* (2013.01); *H01L 2924/18161* (2013.01); *H01L 2924/364* (2013.01)

(56) References Cited

U.S. PATENT DOCUMENTS

| | | | |
|---|---|---|---|
| 2002/0014703 A1* | 2/2002 | Capote | B23K 35/025 257/778 |
| 2004/0079464 A1 | 4/2004 | Kumakura | |
| 2013/0224913 A1* | 8/2013 | Koyama | C08G 59/42 438/124 |
| 2014/0291870 A1 | 10/2014 | Shimba et al. | |
| 2015/0140738 A1 | 5/2015 | Moriyama | |
| 2016/0340557 A1* | 11/2016 | Bai | C08G 59/5073 |

FOREIGN PATENT DOCUMENTS

| | | |
|---|---|---|
| JP | 2013-211352 A | 10/2013 |
| WO | 2013/080708 A1 | 6/2013 |

* cited by examiner

SEMICONDUCTOR DEVICE MANUFACTURING METHOD AND UNDERFILL FILM

TECHNICAL FIELD

The present invention relates to a method for manufacturing a semiconductor device for mounting a semiconductor chip to a substrate or wafer and an underfill film used in the same. This application claims priority to Japanese Patent Application No. 2015-022672 filed on Feb. 6, 2015, the entire content of which is hereby incorporated by reference.

BACKGROUND ART

There have been difficulties in mounting thinner semiconductor chips and 3D mounting with conventional liquid underfill film materials. For this reason, use of pre-applied underfill film (PUF), in which an underfill film is pasted onto a substrate before metal bonding or compression bonding electrodes of a semiconductor IC (integrated circuit) to electrodes of a substrate, has been investigated.

Mounting methods of using such a pre-applied underfill film are performed, for example, as described below (for example, see PLT. 1).

Step A: Paste underfill film to a wafer and dice the wafer to obtain semiconductor chips.

Step B: Align the semiconductor chip on the substrate.

Step C: Compression bond the semiconductor chip and substrate together at a high temperature and pressure; thus, metallic bonding of solder bumps ensures electrical conduction and curing the underfill film bonds the semiconductor chip to the substrate.

As a method for improving per-chip production takt time, multi-head or collective bonding has been proposed. However, multi-head devices are expensive and would increase per-chip cost. Furthermore, in collective bonding, because temperature control with the bonder (heat tool) has been difficult, differences in temperature-increase rates depending on chip position have led to bonding defects such as void generation and resin being sandwiched between bumps.

CITATION LIST

Patent Literature

PLT 1: Japanese Unexamined Patent Application Publication No. 2005-28734

SUMMARY OF THE INVENTION

Technical Problem

The present invention has been proposed in view of such conventional circumstances, and an object of the present invention is to provide a method for manufacturing a semiconductor device which, even in the case of collectively bonding a plurality of semiconductor chips, can achieve voidless mounting and excellent solder bonding properties.

Solution to Problem

As a result of intensive studies, the present inventors have found that by using an underfill film having a predetermined minimum melt viscosity and a predetermined melt viscosity gradient at a temperature higher than a minimum melt viscosity attainment temperature, even in the case of collectively bonding a plurality of semiconductor chips, voidless mounting and excellent solder bonding properties can be achieved.

That is, a method for manufacturing a semiconductor device according to the present invention comprises: a mounting step of mounting a plurality of semiconductor chips having a solder-tipped electrode onto an electronic component having a counter electrode opposing the solder-tipped electrode via an underfill film; and a compression bonding step of collectively bonding the plurality of semiconductor chips to the electronic component via the underfill film, wherein the underfill film contains an epoxy resin, an acid anhydride, an acrylic resin, and an organic peroxide, the underfill film having a minimum melt viscosity of 1,000 to 2,000 Pa*s and a melt viscosity gradient of 900 to 3,100 Pa*s/° C. from a temperature 10° C. higher than a minimum melt viscosity attainment temperature to a temperature 10° C. higher than the temperature.

Moreover, an underfill film for collectively bonding a plurality of semiconductor chips to an electronic component according to the present invention comprises: an epoxy resin, an acid anhydride, an acrylic resin, and an organic peroxide, the underfill film having a minimum melt viscosity of 1,000 to 2,000 Pa*s and a melt viscosity gradient of 900 to 3,100 Pa*s/° C. from a temperature 10° C. higher than a minimum melt viscosity attainment temperature to a temperature 10° C. higher than the temperature.

Advantageous Effects of Invention

According to the present invention, by using an underfill film having a predetermined minimum melt viscosity and a predetermined melt viscosity gradient at a temperature higher than a minimum melt viscosity attainment temperature, even in the case of collectively bonding a plurality of semiconductor chips, it is possible to reduce effects of chip-position-dependent temperature-increase differences and achieve voidless mounting together with excellent solder bonding properties.

DESCRIPTION OF EMBODIMENTS

Hereinafter, embodiments of the present invention will be described in detail in the following order.
1. Underfill Film
2. Semiconductor Device Manufacturing Method
3. Examples 1. Underfill Film The underfill film according to the present embodiment is for collectively bonding a plurality of semiconductor chips to an electronic component and contains an epoxy resin, an acid anhydride, an acrylic resin, and an organic peroxide, the underfill film having a minimum melt viscosity of 1,000 to 2,000 Pa*s and a melt viscosity gradient of 900 to 3,100 Pa*s/t from a temperature 10° C. higher than a minimum melt viscosity attainment temperature to a temperature 10° C. higher than the temperature. Herein, examples of electronic components include bottom chips and circuit substrates, among others, on which a plurality of semiconductor chips are to be mounted.

Figure 1:
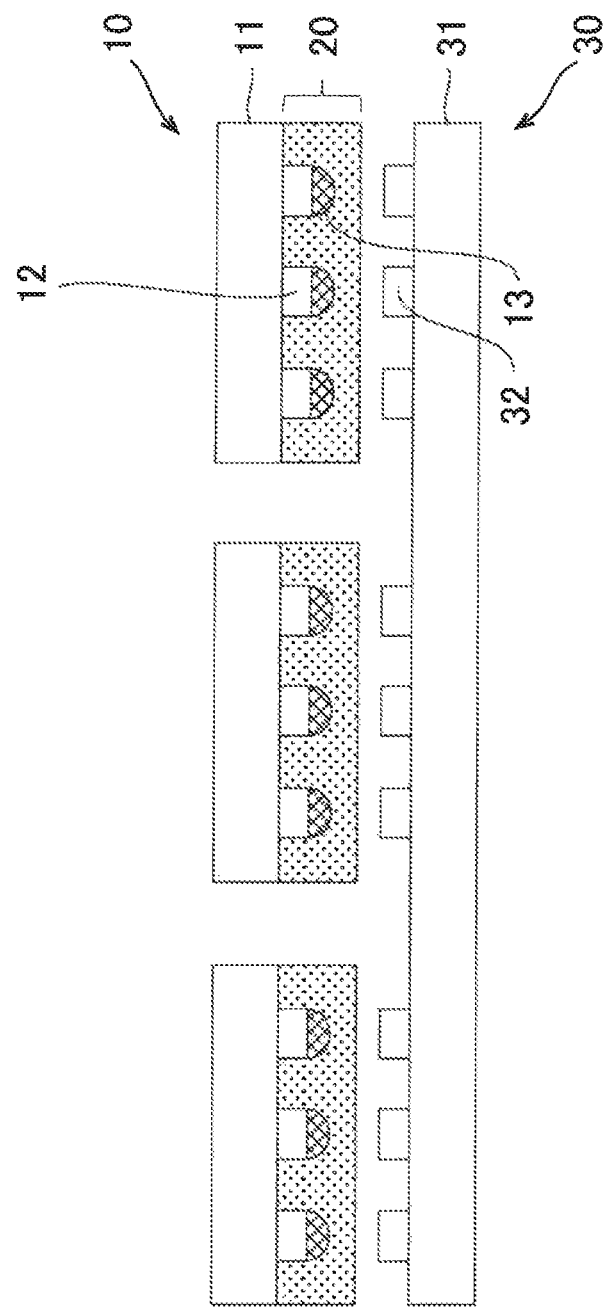
FIG. 1 is a cross-sectional view schematically illustrating a semiconductor chip and a circuit substrate before mounting according to a first example.
Figure 2:
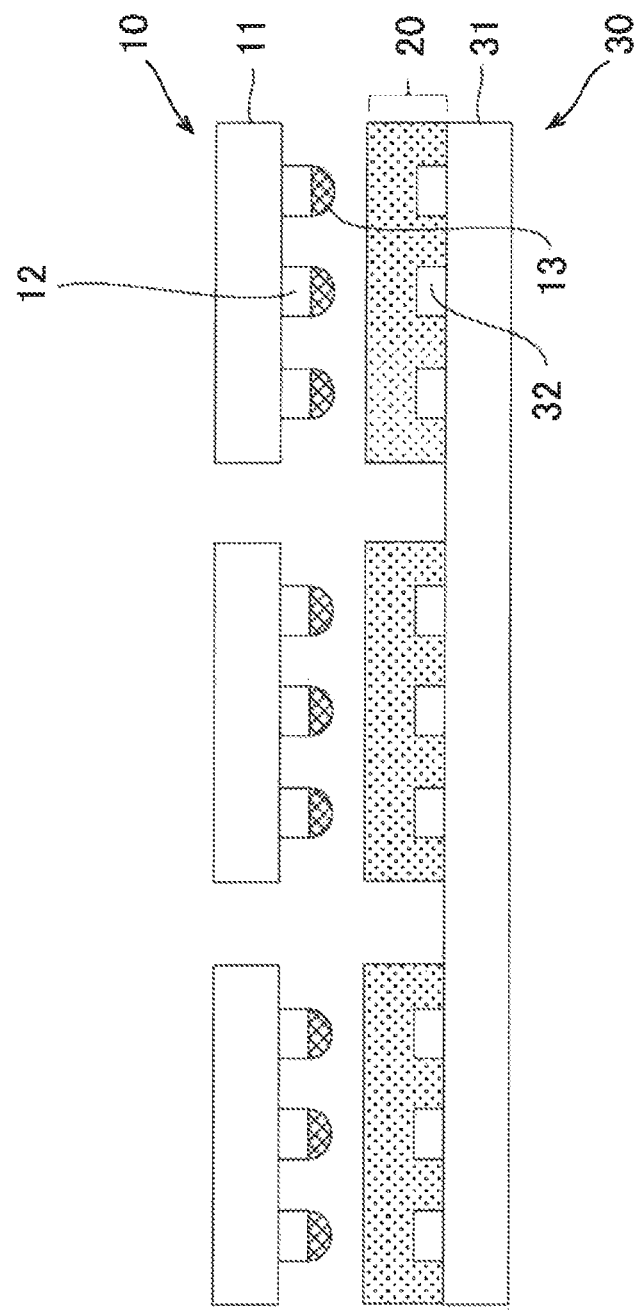
FIG. 2 is a cross-sectional view schematically illustrating a semiconductor chip and a circuit substrate before mounting according to a second example.
Figure 3:
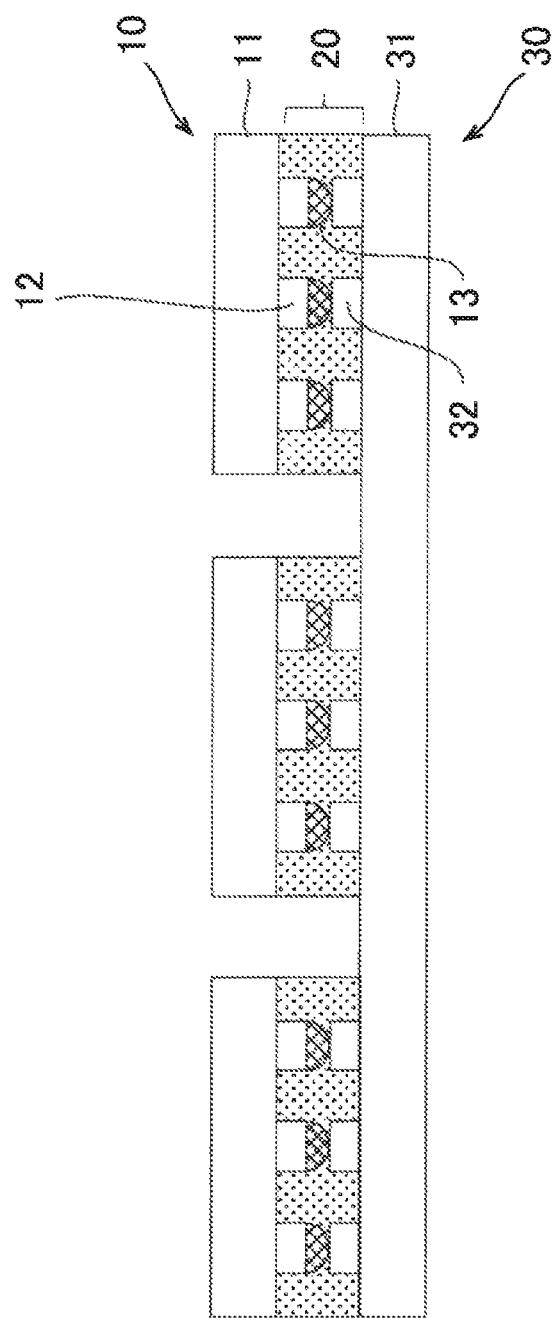
FIG. 3 is a cross-sectional view schematically illustrating a semiconductor chip and a circuit substrate at a time of mounting.
Figure 4:
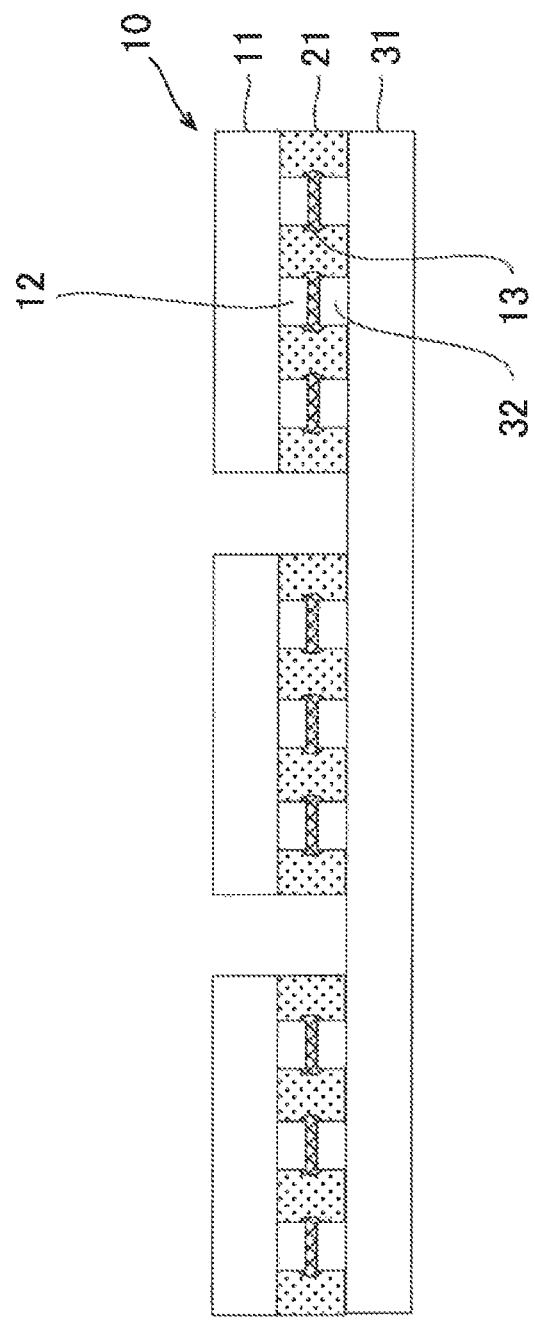
FIG. 4 is a cross-sectional view schematically illustrating a semiconductor chip and a circuit substrate after thermocompression bonding.

FIGS. 1 and 2 are cross-sectional views schematically illustrating semiconductor chips and a circuit substrate before mounting according to a first example and a second example respectively. FIG. 3 is a cross-sectional view schematically illustrating the semiconductor chips and the circuit substrate at a time of mounting and FIG. 4 is a cross-sectional view schematically illustrating the semiconductor chips and the circuit substrate after thermocompression bonding.

As illustrated in FIG. 1, an underfill film 20 is pasted in advance to an electrode-side surface of a semiconductor chip 10 having a solder-tipped electrode 13 formed thereon. Alternatively, as illustrated in FIG. 2, the underfill film 20 may be pasted in advance to an electrode-side surface of a circuit substrate 30 having a counter electrode 32 opposing the solder-tipped electrode 13. Then, as illustrated in FIGS. 3 and 4, the plurality of semiconductor chips 10 are bonded to the circuit substrate 30 by an adhesive layer 21 formed of the cured underfill film 20.

The semiconductor chips 10 include an integrated circuit formed on a surface of a semiconductor 11, such as of silicon, and a connection-use solder-tipped electrode, known as a bump. The solder-tipped electrode includes an electrode 12 comprising copper, for example, to which a solder 13 is bonded, the solder-tipped electrode having a thickness of the combined thicknesses of the electrode 12 and the solder 13.

As the solder, Sn-37Pb eutectic solder (melting point: 183° C.), Sn—Bi solder (melting point: 139° C.), Sn-3.5Ag (melting point: 221° C.), Sn-3.0Ag-0.5Cu (melting point: 217° C.), Sn-5.0Sb (melting point: 240° C.), among others, may be used.

The circuit substrate 30 includes a substrate material 31, for example, a rigid substrate or a flexible substrate, on which a circuit is formed. Furthermore, on a mounting area on which the semiconductor chip 10 is to be mounted, a counter electrode 32 having a predetermined thickness is disposed in a position corresponding to the electrode of the semiconductor chip 10.

The underfill film 20 includes a film-forming resin, an epoxy resin, an acid anhydride, an acrylic resin, and an organic peroxide.

The film-forming resin has a weight-average molecular weight of $10*10^4$ or higher corresponding to a high molecular weight resin, and in view of film forming properties, the weight-average molecular weight is preferably $10*10^4$ to $100*10^4$. Examples usable as the film-forming resin include acrylic rubber polymer, phenoxy resin, epoxy resin, modified epoxy resin, and urethane resin, among a variety of other resins. These film-forming resins may be used individually or in combinations of two or more. Among these, in view of film-strength and adhesive properties, an acrylic rubber polymer having a glycidyl group is preferably used. Examples of commercially available acrylic rubber polymers having a glycidyl group include "Teisan Resin SG-P3" (Nagase ChemteX Corporation), among others.

Examples of epoxy resin include, for example, glycidyl ether-type epoxy resin such as tetrakis(glycidyloxyphenyl) ethane, tetrakis(glycidyloxymethylphenyl)ethane, tetrakis (glycidyloxyphenyl)methane, tris(glycidyloxyphenyl)ethane and tris(glycidyloxyphenyl)methane, and dicyclopentadiene-type epoxy resin, glycidylamine-type epoxy resin, bisphenol A-type epoxy resin, bisphenol F-type epoxy resin, bisphenol S-type epoxy resin, spiro ring-type epoxy resin, naphthalene-type epoxy resin, biphenyl-type epoxy resin, terpene-type epoxy resin, tetrabromobisphenol A-type epoxy resin, cresol novolak-type epoxy resin, phenol novolak-type epoxy resin, α-naphthol novolak-type epoxy resin, and brominated phenol novolak-type epoxy resin, among others. These epoxy resins may be used individually or in a combination of two or more. Among these, glycidyl ether-type epoxy resin, which has high adhesion and heat tolerance, is preferably used in this embodiment. Examples of commercially available glycidyl ether-type epoxy resin include trade name "JER1031S" (Mitsubishi Chemical Corporation)

The acid anhydride functions as a flux for removing oxide film on the solder surface, enabling excellent connection reliability to be achieved. Examples of acid anhydride include alicyclic acid anhydrides such as hexahydrophthalic anhydride and methyltetrahydrophthalic anhydride, aliphatic acid anhydrides such as tetrapropenyl succinic anhydride and dodecenyl succinic anhydride, and aromatic acid anhydrides such as phthalic anhydride, trimellitic anhydride, and pyromellitic anhydride, among others. These epoxy curing agents may be used individually or in a combination of two or more. Among these epoxy curing agents, in view of solder connectivity, an alicyclic acid anhydride is preferably used. Examples of commercially available products of alicyclic acid anhydride include trade name (RIKACID HNA-100, New Japan Chemical Co., Ltd.), among others.

Moreover, it is also preferable to add a curing accelerator. In particular, examples of curing accelerator include 1,8-diazabicyclo[5.4.0]undec-7-ene salts (DBU salt), imidazoles such as 2-methylimidazole, 2-ethylimidazole and 2-ethyl-4-methylimidazole, tertiary amines such as 2-(dimethylaminomethyl)phenol, phosphines such as triphenylphosphine, and metallic compounds such as tin octylate.

As the acrylic resin, monofunctional (meth)acrylate, bifunctional (meth)acrylate, or higher functional (meth) acrylate can be used. Examples of monofunctional (meth) acrylates include methyl (meth)acrylate, ethyl (meth)acrylate, n-propyl (meth)acrylate, i-propyl (meth)acrylate and n-butyl (meth)acrylate. Examples of the bifunctional or higher functional (meth) acrylates include fluorene-based acrylate, bisphenol F EO-modified di(meth)acrylate, bisphenol A EO-modified di(meth)acrylate, trimethylolpropane PO-modified (meth)acrylate, and multifunctional urethane (meth)acrylate, among others. These acrylic resins may be used individually or in a combination of two or more. Among these, fluorene-based acrylate is preferably used in the present embodiment. Examples of commercially available fluorene-based acrylate include trade name "OGSOL EA-0200" (OSAKA ORGANIC CHEMICAL INDUSTRY LTD.), among others.

Examples of organic peroxide include, peroxyketal, peroxyester, hydroperoxide, dialkyl peroxide, diacyl peroxide and peroxydicarbonate, among others. These organic peroxides may be used individually or in a combination of two or more. Of these, peroxyketal is preferably used in the present embodiment. Examples of commercially available products of peroxyketal include trade name "PERHAXA V" (NOF CORPORATION), among others.

As an additive composition, it is preferable to add an inorganic filler. By containing an inorganic filler, fluidity of the resin layer at the time of compression bonding can be adjusted. As an inorganic filler, silica, talc, titanium oxide, calcium carbonate and magnesium oxide, among others, can be used.

Moreover, epoxy-based, amino-based, mercapto-sulfide-based, or ureide-based silane coupling agents may be added as necessary.

By thus using a combination of an epoxy-based agent having a relatively slow curing reaction and an acrylic-based agent having a relatively fast curing reaction, temperature-increase rate margins for bonding conditions are enlarged and, even in the case of collectively bonding a plurality of semiconductor chips, effects of chip-position-dependent temperature-increase rate differences are mitigated and it is possible to realize voidless mounting together with excellent solder bonding properties.

Figure 5:
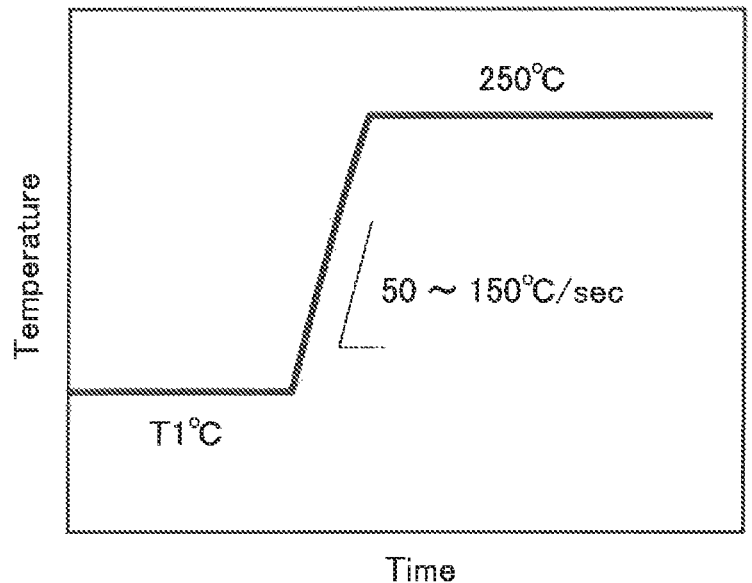
FIG. 5 is a graph showing one example of a bonding condition.

FIG. 5 is a graph showing one example of a bonding condition. The bonding condition is a temperature increase from a temperature T1 to 250° C. at a temperature-increase rate of 50 to 150° C./sec. Herein, the temperature T1 is preferably substantially the same as the minimum melt viscosity of the underfill film and preferably 50 to 150° C.

Figure 6:
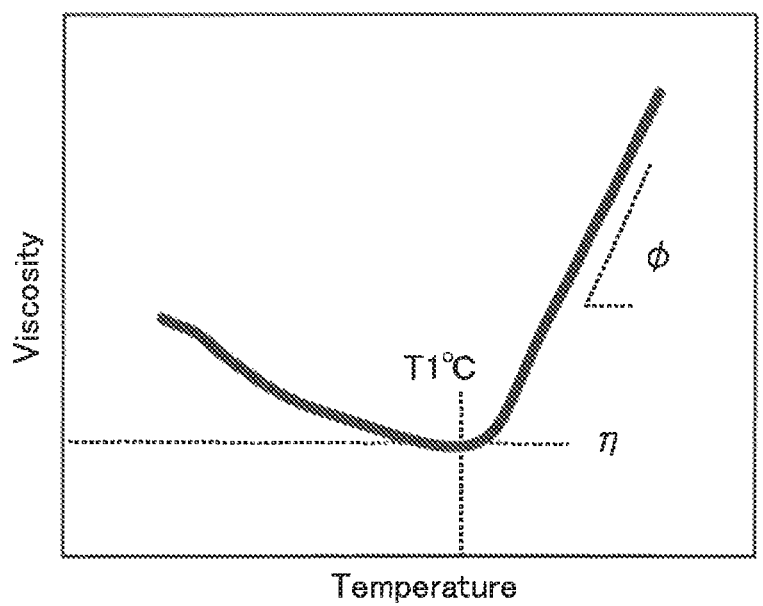
FIG. 6 is a graph showing a melt viscosity curve of an underfill film suitable for the bonding condition illustrated in FIG. 4.

FIG. 6 is a graph illustrating a melt viscosity curve of an underfill film suitable for the bonding condition illustrated in FIG. 5. The melt viscosity curve was obtained by measuring the underfill film with a rheometer under conditions of 5° C./min and 1 Hz.

A minimum melt viscosity η of 1,000 to 2,000 Pa*s for the underfill film is suitable for these bonding conditions. It is thus possible to suppress void generation at the time of thermocompression bonding. Furthermore, the minimum melt viscosity attainment temperature of the underfill film is preferably 125° C. or less. Furthermore, the elastic modulus of the underfill film is preferably 1 GPa to 10 GPa.

Moreover, the melt viscosity gradient from a temperature that is 10° C. higher than the minimum melt viscosity attainment temperature of the underfill film to a temperature that is a further 10° C. higher than this temperature is 900 to 3,100 Pa*s/° C. This enables voidless mounting and excellent solder connection properties under the bonding conditions of a temperature-increase rate of 50 to 150° C./sec. That is, with the underfill film, the temperature-increase rate margins for the bonding conditions are large and, even in the case of collectively bonding a plurality of semiconductor chips, it is possible to mitigate effects of chip-position-dependent temperature-increase differences and achieve voidless mounting together with excellent solder bonding properties. In addition, because the underfill film can suppress the formation of fillets on chip side-surfaces, it is possible to reduce chip-spacing between adjacent chips. Moreover, such a fillet-less configuration can prevent deposition to tools and can obviate use of buffer material.

The minimum melt viscosity attainment temperature is preferably substantially the same as the temperature T1 of the bonding conditions. This makes it possible to obtain an underfill film having curing behavior suitable to the bonding conditions.

A ratio of the total mass of acrylic resin and organic peroxide to the total mass of epoxy resin and acid anhydride is preferably 7:3 to 4:6 and more preferably 7:3 to 5:5. Because this enlarges the temperature-increase rate margins for bonding conditions, even in the case of collectively bonding a plurality of semiconductor chips, it is possible to mitigate effects of chip-position-dependent temperature-increase rate differences and achieve voidless mounting together with excellent solder bonding properties.

Next, a method for manufacturing the aforementioned underfill film will be described. First, an adhesive composition containing a film-forming resin, an epoxy resin, an acid anhydride, an acrylic resin, and an organic peroxide is dissolved in a solvent. Examples usable as the solvent include toluene and ethyl acetate, among others, or a mixture thereof. After being prepared, the resin composition is coated to a release-treated substrate with, for example, a bar coater or other coating device.

The release-treated substrate comprises a laminated structure formed by coating, for example, PET (polyethylene terephthalate), OPP (oriented polypropylene), PMP (poly-4-methylpentene-1), PTFE (polytetrafluorethylene), among others, with a release agent such as silicone, and is for preventing drying of the composition and maintaining the shape of the composition.

Subsequently, the resin composition coated to the release-treated substrate is dried by placing into, for example, an oven or a heating and drying device. A pre-applied underfill film having a predetermined thickness can thus be obtained.

2. Semiconductor Device Manufacturing Method

Next, a method for manufacturing a semiconductor device using the aforementioned underfill film will be described. A manufacturing method of a semiconductor device according to this embodiment includes a mounting step of mounting a plurality of semiconductor chips having a solder-tipped electrode onto an electronic component having a counter electrode opposing the solder-tipped electrode via an underfill film; and a compression bonding step of collectively bonding the plurality of semiconductor chips to the electronic component via the underfill film. The underfill film used in this method, as described above, includes an epoxy resin, an acid anhydride, an acrylic resin, and an organic peroxide, the underfill film having a minimum melt viscosity of 1,000 to 2,000 Pa*s and a melt viscosity gradient of 900 to 3,100 Pa*s/° C. from a temperature 10° C. higher than a minimum melt viscosity attainment temperature to a temperature 10° C. higher than the temperature.

Figure 7:
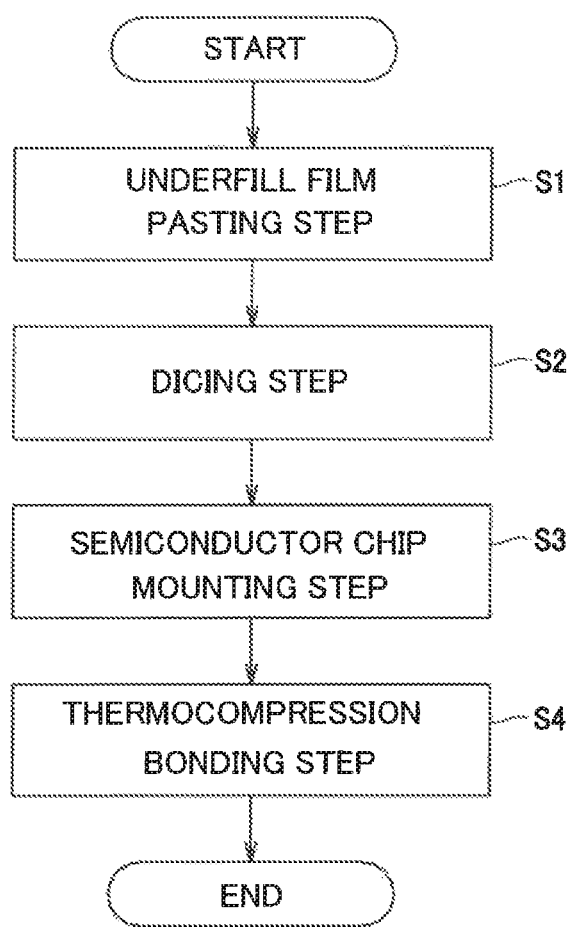
FIG. 7 is a flowchart showing a method for manufacturing a semiconductor device according to an embodiment.

FIG. 7 is a flowchart showing a method for manufacturing a semiconductor device. As illustrated in FIG. 7, a method of manufacturing a semiconductor device according to this embodiment includes an underfill film pasting step S1, a dicing step S2, a semiconductor chip mounting step S3, and a thermocompression bonding step S4.

Figure 8:
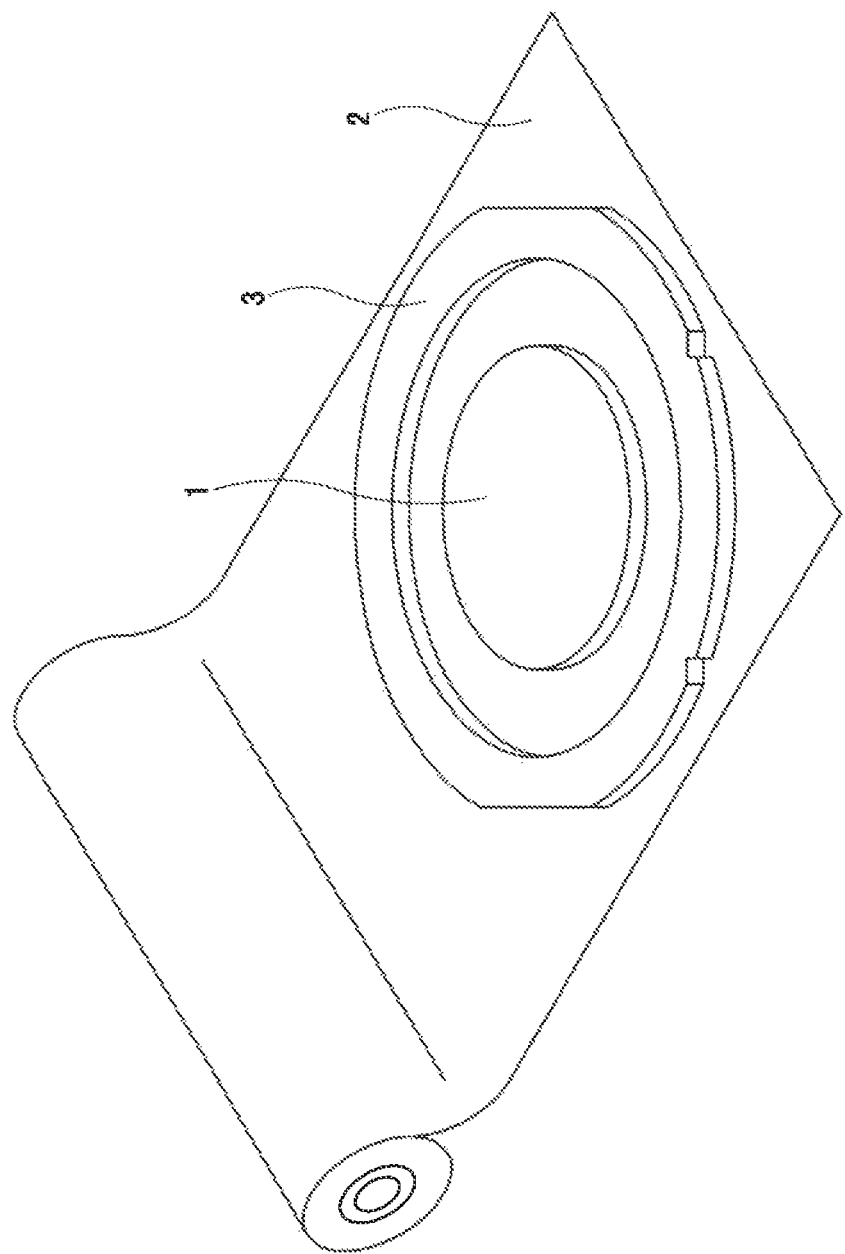
FIG. 8 is a perspective view schematically illustrating a step of pasting an underfill film on a wafer.

FIG. 8 is a perspective view schematically illustrating a step of pasting an underfill film onto a wafer. As illustrated in FIG. 8, in the underfill film pasting step S1, the wafer 1 is secured by a jig 3 having a ring-shaped or frame-shaped frame having a diameter larger than the diameter of the wafer 1, and the underfill film 2 is pasted onto the wafer 1. The underfill film 2 functions as a dicing tape for protecting and securing the wafer 1 during dicing of the wafer 1 in addition to holding the wafer 1 at the time of pick-up. It should be noted that many ICs (integrated circuits) are formed on the wafer 1; each of the semiconductor chips 10, demarked by scribe lines on a bonding side of the wafer 1, are provided with solder-tipped electrodes.

Figure 9:
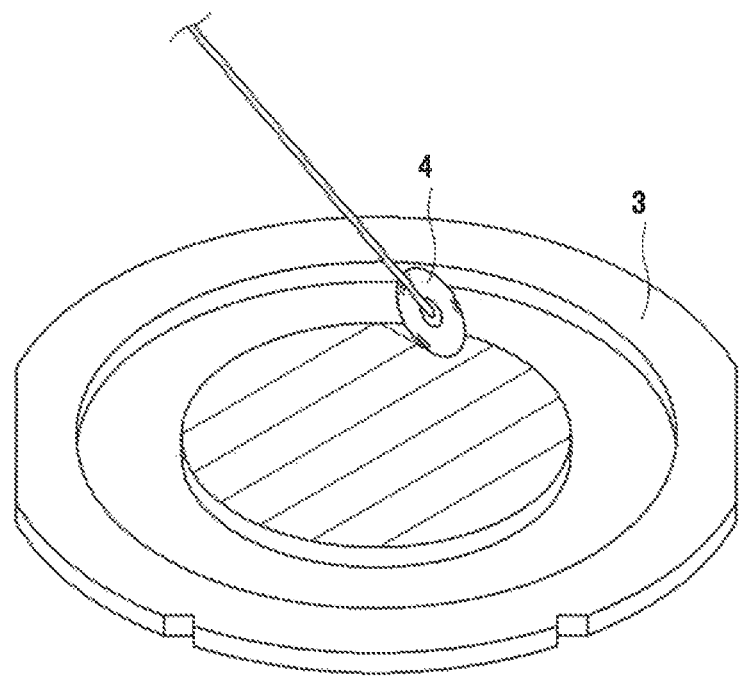
FIG. 9 is a perspective view schematically illustrating a step of dicing a wafer.

FIG. 9 is a perspective view schematically illustrating a step of dicing the wafer. As illustrated in FIG. 9, in the dicing step S2, a blade 4 is pressed along the scribe lines to cut the wafer 1 into individual separated semiconductor chips.

Figure 10:
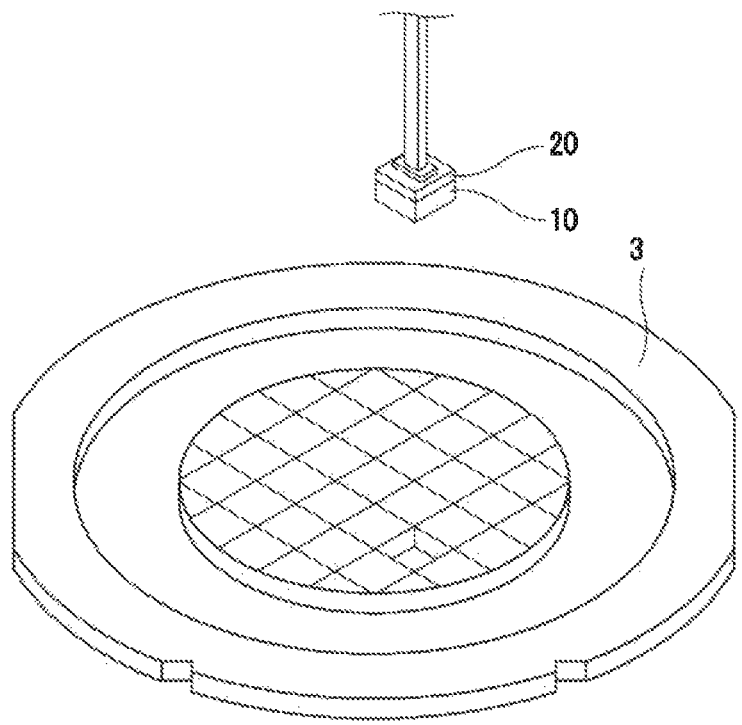
FIG. 10 is a perspective view schematically illustrating a step of picking up a semiconductor chip.

FIG. 10 is a perspective view schematically illustrating a step of picking up a semiconductor chip. As illustrated in FIG. 10, the semiconductor chips 10, each being attached to the underfill film, are held by the underfill film and picked up.

In the semiconductor chip mounting step S3, as illustrated in FIG. 3, the semiconductor chips 10 attached to the underfill film and the circuit substrate 30 are positioned so that the underfill film interposes therebetween. The semiconductor chips 10 attached to the underfill film are then aligned so that the solder-tipped electrode and the counter electrode 32 oppose each other. Subsequently, heat and pressure are applied by a hot bonder to mount under conditions of a predetermined temperature, pressure, and time such that the underfill film can flow but not be cured.

The temperature condition at the time of mounting is preferably 30 to 155° C. Furthermore, the pressure condition is preferably 60 N or less and more preferably 50 N or less. Furthermore, the time condition is preferably 0.5 to 10 seconds and more preferably 0.1 to 3.0 seconds. Thus, the solder-tipped electrode can be brought into contact with the electrode of the circuit substrate 30 side without melting and without completely curing the underfill film. Furthermore, affixing at a low temperature can suppress void generation and reduce damage to the semiconductor chips 10.

Next, in the thermocompression bonding step S4, using a gang bonder, solder of the solder-tipped electrodes of the plurality of semiconductor chips 10 is melted to form a metal bond and the underfill film is completely cured, thus achieving collective bonding.

Figure 11:
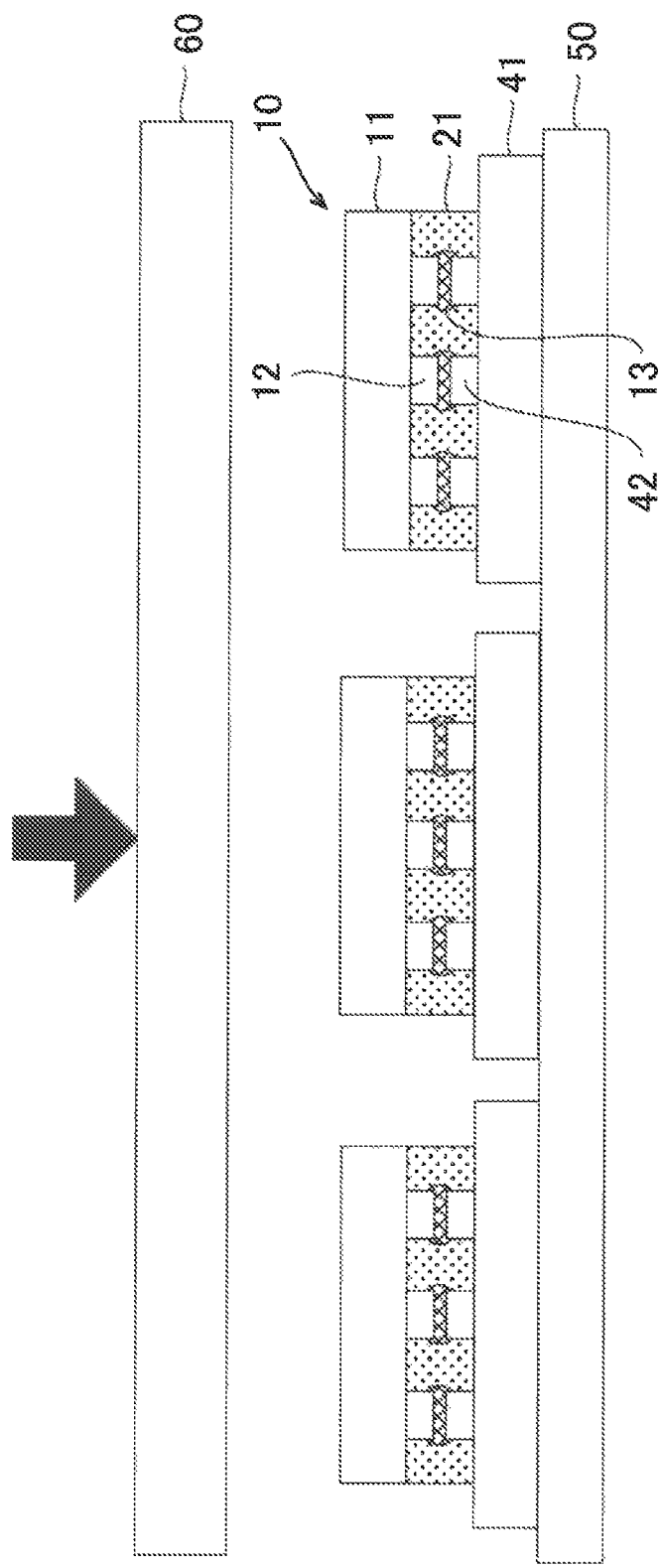
FIG. 11 is a cross-sectional view schematically illustrating a step of collectively bonding a plurality of semiconductor chips.
Figure 12:
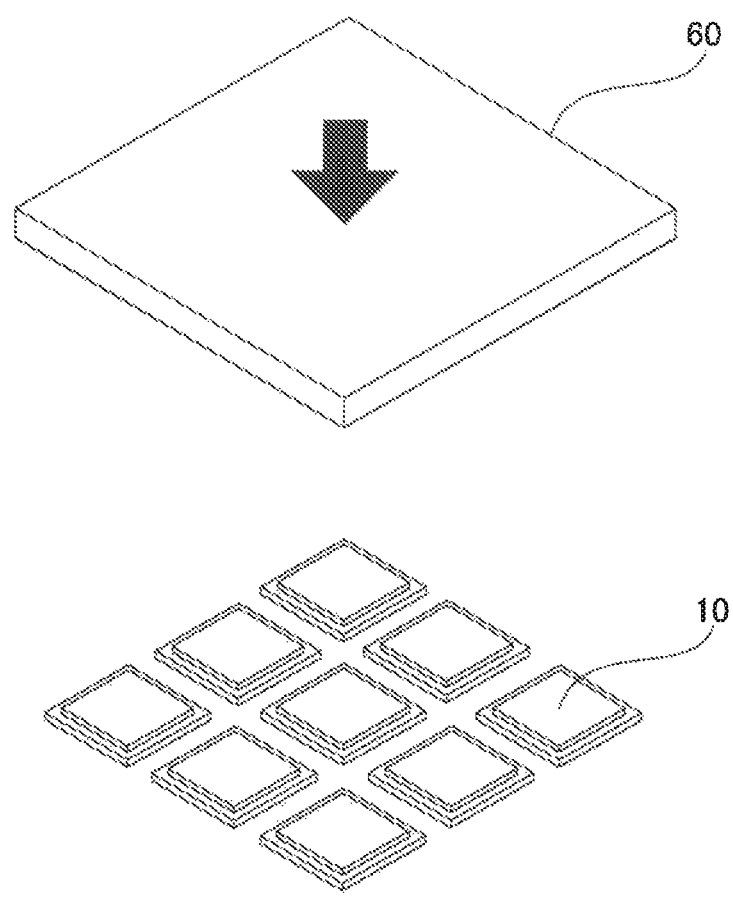
FIG. 12 is a perspective view schematically illustrating a step of collectively bonding a plurality of semiconductor chips.

FIGS. 11 and 12 schematically illustrate a step of collectively bonding a plurality of semiconductor chips and are a cross-sectional view and a perspective view respectively. In FIGS. 11 and 12, as electronic components, bottom chips 41 are arranged in a 3×3 array on a stage 50. Then, the semiconductor chips 10 are mounted on the bottom chips 41, and, in a 3×3 arrangement, the semiconductor chips are collectively bonded by a heat tool 60 so that the semiconductor chips 10 are connected to the bottom chips 41 by an adhesive layer 21 formed of the cured underfill film.

The temperature condition at the time of collective bonding is preferably 150 to 300° C. and more preferably 230 to 280° C. Furthermore, the pressure condition is preferably 60 N or less and more preferably 50 N or less. Furthermore, the time condition is preferably 0.1 to 60 seconds and more preferably 5 to 20 seconds. It is thus possible to metal-bond the solder-tipped electrode and the substrate electrode as well as completely cure the underfill film so that electrodes of the plurality of semiconductor chips 10 and electrodes of the circuit substrate 30 can be electrically and mechanically pressure bonded together collectively.

Thus, by using an underfill film having a predetermined minimum melt viscosity and a predetermined melt viscosity gradient at a temperature higher than a minimum melt viscosity attainment temperature, even in the case of collectively bonding a plurality of semiconductor chips, it is possible to achieve voidless mounting together with excellent solder bonding properties.

It should be noted that in the embodiment described above, the underfill film functioned as a dicing tape; however, flip-chip mounting may be performed using a mounting method in which a separate dicing tape is used and the underfill film is used after dicing.

Other Embodiments

The present technology is also applicable in TSV (through silicon via) techniques in which metal is filled into small holes provided in semiconductor chips to electrically connect a plurality of laminated chip substrates in a sandwich configuration.

That is, the present invention is also applicable to a method for manufacturing a semiconductor device in which a plurality of chip substrates having a first surface on which a solder-tipped electrode is formed and, opposite to the first surface, a second surface on which a counter electrode opposing the solder-tipped electrode is formed, are laminated.

In this case, the underfill film is pasted to the first surface side of a first chip substrate; in this state, the first chip substrate is mounted onto the second surface of a second chip substrate. Thereafter, the first surface of the first chip substrate and the second surface of the second chip substrate are thermocompression-bonded at a temperature at or above the melting point of the solder of the solder-tipped electrode; it is thus possible to obtain a semiconductor device having a plurality of laminated chip substrates.

EXAMPLES

3. Examples

Hereinafter, examples of the present invention will be described. In these examples, a pre-applied underfill film was prepared; next, the underfill film was used to collectively bond a plurality of top chips having solder-tipped electrodes to bottom chips having counter electrodes by using a gang bonding device such as that illustrated in FIGS. 11 and 12 to prepare package bodies which were evaluated for voids, solder bonding properties, and fillets.

Reference examples will first be explained in which underfill films were used to connect IC chips having solder-tipped electrodes to IC substrates having opposing electrodes by mounting the chips individually with one chip per head to prepare package bodies which were evaluated for voids and solder bonding properties.

3.1 Reference Examples

First, in the reference examples, with one chip per head, chips were individually connected using underfill films to prepare package bodies which were evaluated for voids and solder bonding properties. The minimum melt viscosity and the melt viscosity gradient of the underfill film were measured, the package bodies were prepared, and voids as well as solder bonding were evaluated in the following manner.

Minimum Melt Viscosity Measurement and Melt Viscosity Gradient Calculation

As in the examples of 3.1, a rheometer (ARES, TA Instruments) was used to measure the minimum melt viscosity and the minimum melt viscosity attainment temperature of the samples of each of the underfill films under conditions of 5° C./min and 1 Hz. Then, the melt viscosity gradient from the minimum melt viscosity attainment temperature+10° to the minimum melt viscosity attainment temperature+20° C. was calculated.

Package Body Preparation

The underfill film was pasted using a press device under conditions of 50° C. and 0.5 MPa onto a wafer which was then diced to obtain IC chips having the solder-tipped electrode.

The IC chips had 7 mm dimensions, a thickness of 200 μm, and peripheral bumps (φ30 μm, 85 μm pitch, 280 pins) comprising 20 μm thick Cu electrodes tipped with 16 μm thick solder (Sn-3.5Ag, melting point 221° C.) formed thereon.

Similarly, the opposing IC chips had 7 mm dimensions, a thickness of 200 μm, and peripheral bumps (φ30 μm, 85 μm pitch, 280 pins) comprising 20 μm thick Cu electrodes formed thereon.

Next, a flip-chip bonder was used to mount the IC chips onto the IC substrates under conditions of 60° C., 0.5 seconds, and 30 N.

As in the bonding conditions illustrated in FIG. 5, the flip-chip bonder was then used to thermocompression-bond at a temperature-increase rate of 50° C./sec from the minimum melt viscosity attainment temperature of the underfill film to 250° C. Furthermore, the bonder head was lowered (with 30 N) to the lowest position within the duration of temperature-increase from the minimum melt viscosity attainment temperature to 250° C. Then, by curing at 150° C. for 2 hours, a first package body was obtained. Similarly, the flip-chip bonder was used to thermocompression-bond at a temperature-increase rate of 150° C./sec from the minimum melt viscosity attainment temperature of the underfill film to 250° C. Furthermore, the bonder head was lowered (with 30 N) to the lowest position within the duration of temperature-increase from the minimum melt viscosity attainment temperature to 250° C. Then, by curing at 150° C. for 2 hours, a second package body was obtained. It should be noted that the temperatures during use of the flip-chip bonder were the actual temperatures of the samples and were measured with a thermocouple.

Void Evaluation

The first package body obtained by thermocompression bonding with a temperature-increase rate of 50° C./sec and the second package body obtained by thermocompression bonding with a temperature-increase rate of 150° C./sec were observed using SAT (scanning acoustic tomography, ultrasound imaging device). Cases in which voids were generated in neither the first package body nor the second package body were evaluated as "pass" (hereinafter represented as "P") and cases in which voids were generated in either of the package bodies were evaluated as "fail" (hereinafter represented as "F"). Void generation generally increases the likelihood of adverse effects to long-term reliability.

Solder Bonding Evaluation

Samples of the first package body obtained by thermocompression bonding with a temperature-increase rate of 50° C./sec and the second package body obtained by thermocompression bonding with a temperature-increase rate of 150° C./sec were cut and the cut surfaces were polished; then, an SEM (scanning electron microscope) was used to observe the state of solder between the IC chip electrodes and the IC substrate electrodes. Cases in which solder connections and solder wetting were favorable in both the first package body and the second package body were evaluated as "pass" (hereinafter represented as "P") and cases of either inadequate solder connections or solder wetting in either were evaluated as "fail" (hereinafter represented as "F").

Reference Example 1

A 70/30 acrylic/epoxy resin composition was prepared by blending 40 pts. mass of an acrylic rubber polymer (Teisan Resin SG-P3, Nagase ChemteX Corporation) as a film forming resin, 20 pts. mass of an epoxy (JER1031S, Mitsubishi Chemical Corporation), 10 pts. mass of acid anhydride (RIKACID HNA-100, New Japan Chemical Co. Ltd.), 1 pt. mass of an imidazole as a curing accelerator (U-CAT-5002, San-Apro Co. Ltd.), 68 pts. mass of an acrylic resin (OGSOL EA-0200, OSAKA ORGANIC CHEMICAL INDUSTRY LTD.), 2 pts. mass of an organic peroxide (PERHEXA V, NOF CORPORATION), and 15 pts. mass of a filler (AEROSIL R202, NIPPON AEROSIL CO. LTD.). This was coated to release treated PET (polyethylene terephthalate) using a bar coater and dried in an oven at 80° C. for 3 minutes to prepare an underfill film having a thickness of 50 μm (cover release-treated PET (25 μm)/underfill film (50 μm)/base release-treated PET (50 μm).

Figure 13:
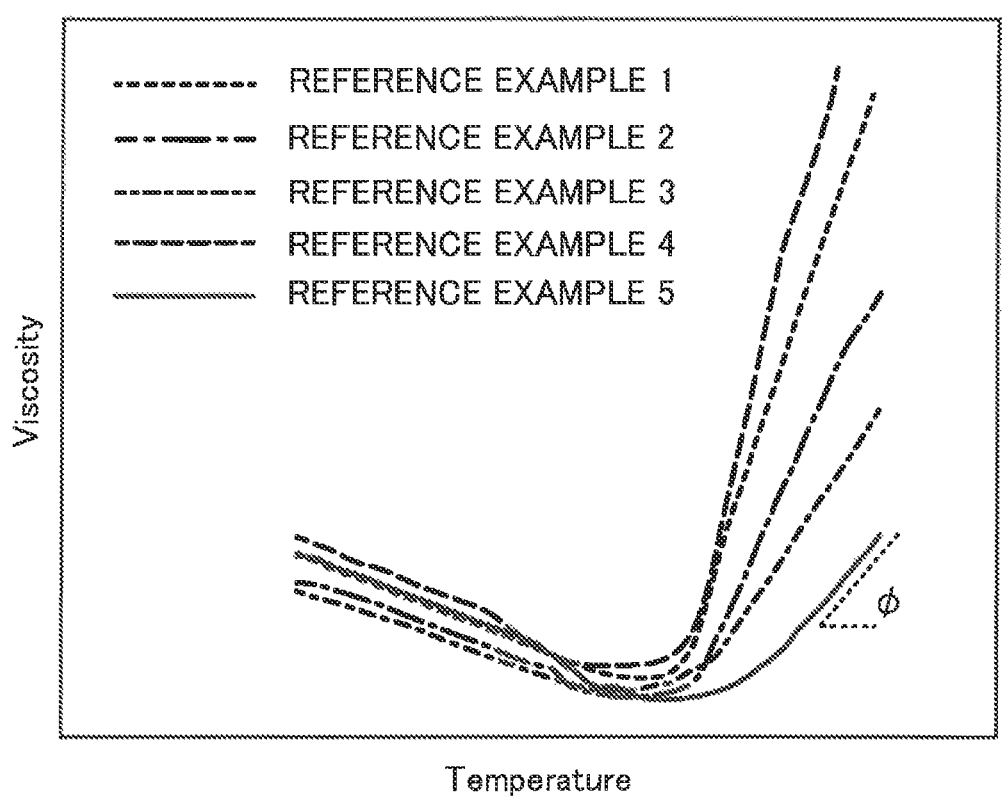
FIG. 13 is a graph showing a melt viscosity curve of a sample underfill film.

Melt viscosity curves of Reference Example 1 are shown in FIG. 13. Evaluation results of the underfill film of Reference Example 1 are represented in Table 1. The minimum melt viscosity of the underfill film was 1,490 Pa*s and the minimum melt viscosity attainment temperature was 113° C. Additionally, the melt viscosity gradient φ from 123 to 133 was 3,100 Pa*s/° C. Moreover, package bodies prepared with this underfill film were evaluated as P for voids and P for solder bonding.

Reference Example 2

A 50/50 acrylic/epoxy resin composition was prepared by blending 40 pts. mass of an acrylic rubber polymer (Teisan Resin SG-P3, Nagase ChemteX Corporation) as a film forming resin, 30 pts. mass of an epoxy (JER1031S, Mitsubishi Chemical Corporation), 20 pts. mass of acid anhydride (RIKACID HNA-100, New Japan Chemical Co. Ltd.), 1 pt. mass of an imidazole as a curing accelerator (U-CAT-5002, San-Apro Co. Ltd.), 49 pts. mass of an acrylic resin (OGSOL EA-0200, OSAKA ORGANIC CHEMICAL INDUSTRY LTD.), 1 pt. mass of an organic peroxide (PERHEXA V, NOF CORPORATION), and 15 pts. mass of a filler (AEROSIL R202, NIPPON AEROSIL CO. LTD.). This was coated to release treated PET (polyethylene terephthalate) using a bar coater and dried in an oven at 80° C. for 3 minutes to prepare an underfill film having a thickness of 50 μm (cover release-treated PET (25 μm)/underfill film (50 μm)/base release-treated PET (50 μm).

Melt viscosity curves of Reference Example 2 are shown in FIG. 13. Evaluation results of the underfill film of Reference Example 2 are represented in Table 1. The minimum melt viscosity of the underfill film was 1,330 Pa*s and the minimum melt viscosity attainment temperature was 112° C. Additionally, the melt viscosity gradient φ from 122 to 132° C. was 1,700 Pa*s/° C. Moreover, package bodies prepared with this underfill film were evaluated as P for voids and P for solder bonding.

Reference Example 3

A 50/50 acrylic/epoxy resin composition was prepared by blending 40 pts. mass of an acrylic rubber polymer (Teisan Resin SG-P3, Nagase ChemteX Corporation) as a film forming resin, 45 pts. mass of an epoxy (JER1031S, Mitsubishi Chemical Corporation), 15 pts. mass of acid anhydride (RIKACID HNA-100, New Japan Chemical Co. Ltd.), 1 pt. mass of an imidazole as a curing accelerator (U-CAT-5002, San-Apro Co. Ltd.), 39 pts. mass of an acrylic resin (OGSOL EA-0200, OSAKA ORGANIC CHEMICAL INDUSTRY LTD.), 1 pt. mass of an organic peroxide (PERHEXA V, NOF CORPORATION), and 15 pts. mass of a filler (AEROSIL R202, NIPPON AEROSIL CO. LTD.). This was coated to release treated PET (polyethylene terephthalate) using a bar coater and dried in an oven at 80° C. for 3 minutes to prepare an underfill film having a thickness of 50 µm (cover release-treated PET (25 µm)/underfill film (50 µm)/base release-treated PET (50 µm).

Melt viscosity curves of Reference Example 3 are shown in FIG. 13. Evaluation results of the underfill film of Reference Example 3 are represented in Table 1. The minimum melt viscosity of the underfill film was 1,390 Pa*s and the minimum melt viscosity attainment temperature was 113° C. Additionally, the melt viscosity gradient φ from 123 to 133° C. was 900 Pa*s/° C. Moreover, package bodies prepared with this underfill film were evaluated as P for voids and P for solder bonding.

Reference Example 4

An 80/20 acrylic/epoxy resin composition was prepared by blending 40 pts. mass of an acrylic rubber polymer (Teisan Resin SG-P3, Nagase ChemteX Corporation) as a film forming resin, 13 pts. mass of an epoxy (JER1031S, Mitsubishi Chemical Corporation), 7 pts. mass of acid anhydride (RIKACID HNA-100, New Japan Chemical Co. Ltd.), 1 pt. mass of an imidazole as a curing accelerator (U-CAT-5002, San-Apro Co. Ltd.), 76 pts. mass of an acrylic resin (OGSOL EA-0200, OSAKA ORGANIC CHEMICAL INDUSTRY LTD.), 4 pts. mass of an organic peroxide (PERHEXA V, NOF CORPORATION), and 15 pts. mass of a filler (AEROSIL R202, NIPPON AEROSIL CO. LTD.). This was coated to release treated PET (polyethylene terephthalate) using a bar coater and dried in an oven at 80° C. for 3 minutes to prepare an underfill film having a thickness of 50 µm (cover release-treated PET (25 µm)/underfill film (50 µm)/base release-treated PET (50 µm).

Melt viscosity curves of Reference Example 4 are shown in FIG. 13. Evaluation results of the underfill film of Reference Example 4 are represented in Table 1. The minimum melt viscosity of the underfill film was 1,950 Pa*s and the minimum melt viscosity attainment temperature was 113° C. Additionally, the melt viscosity gradient φ from 123 to 133° C. was 4,000 Pa*s/° C. Moreover, package bodies prepared with this underfill film were evaluated as P for voids and F for solder bonding.

Reference Example 5

A 30/70 acrylic/epoxy resin composition was prepared by blending 40 pts. mass of an acrylic rubber polymer (Teisan Resin SG-P3, Nagase ChemteX Corporation) as a film forming resin, 40 pts. mass of an epoxy (JER1031S, Mitsubishi Chemical Corporation), 30 pts. mass of acid anhydride (RIKACID HNA-100, New Japan Chemical Co. Ltd.), 1 pt. mass of an imidazole as a curing accelerator (U-CAT-5002, San-Apro Co. Ltd.), 29 pts. mass of an acrylic resin (OGSOL EA-0200, OSAKA ORGANIC CHEMICAL INDUSTRY LTD.), 1 pt. mass of an organic peroxide (PERHEXA V, NOF CORPORATION), and 15 pts. mass of a filler (AEROSIL R202, NIPPON AEROSIL CO. LTD.). This was coated to release-treated PET (polyethylene terephthalate) using a bar coater and dried in an oven at 80° C. for 3 minutes to prepare an underfill film having a thickness of 50 µm (cover release-treated PET (25 µm)/underfill film (50 µm)/base release-treated PET (50 µm).

Melt viscosity curves of Reference Example 5 are shown in FIG. 13. Evaluation results of the underfill film of Reference Example 5 are represented in Table 1. The minimum melt viscosity of the underfill film was 1,300 Pa*s and the minimum melt viscosity attainment temperature was 115° C. Additionally, the melt viscosity gradient φ from 125 to 135° C. was 400 Pa*s/° C. Moreover, package bodies prepared with this underfill film were evaluated as F for voids and P for solder bonding.

TABLE 1

| Type | Trade Name | Ref. 1 | Ref. 2 | Ref. 3 | Ref. 4 | Ref. 5 |
| --- | --- | --- | --- | --- | --- | --- |
| Film-Forming Resin | Teisan Resin SG-P3 (Nagase ChemteX Corporation) | 40 | 40 | 40 | 40 | 40 |
| Acrylic Resin | OGSOL EA-0200 (OSAKA ORGANIC CHEMICAL INDUSTRY LTD.) | 68 | 49 | 39 | 76 | 29 |
| Organic Peroxide | PERHEXA V (NOF CORPORATION) | 2 | 1 | 1 | 4 | 1 |
| Epoxy | JER1031S (Mitsubishi Chemical Corporation) | 20 | 30 | 45 | 13 | 40 |
| Acid Anhydride | RIKACID HNA-100 (New Japan Chemical Co. Ltd.) | 10 | 20 | 15 | 7 | 30 |
| Curing Accelerator | U-CAT-5002 (San-Apro Co. Ltd.) | 1 | 1 | 1 | 1 | 1 |
| Filler | AEROSIL R202 (NIPPON AEROSIL CO. LTD.) | 15 | 15 | 15 | 15 | 15 |
| | Total | 156 | 156 | 156 | 156 | 156 |
| | Acrylic Ratio | 70 | 50 | 40 | 80 | 30 |
| | Epoxy Ration | 30 | 50 | 60 | 20 | 70 |
| | Minimum Melt Viscosity [Pa*s] | 1490 | 1330 | 1390 | 1950 | 1300 |

TABLE 1-continued

| Type | Trade Name | Ref. 1 | Ref. 2 | Ref. 3 | Ref. 4 | Ref. 5 |
|---|---|---|---|---|---|---|
| | Minimum Melt Viscosity Attainment Temperature [° C.] | 113 | 112 | 113 | 113 | 115 |
| | Melt Viscosity Gradient φ [Pa*s/° C.] | 3100 | 1700 | 900 | 4000 | 400 |
| | Voids | P | P | P | P | F |
| | Solder Bonding Properties | P | P | P | F | P |

In the case of the melt viscosity gradient φ exceeding 3,100 Pa*s/° C. as in Reference Example 4, although voidless mounting was possible, defects in solder bonds occurred in both the first package body obtained by thermocompression bonding with a temperature-increase rate of 50° C./sec and the second package body obtained by thermocompression bonding with a temperature-increase rate of 150° C./sec. In the case of the melt viscosity gradient φ falling short of 900 Pa*s/° C. as in Reference Example 5, although solder bonding was favorable, voids were present within the second package body obtained by thermocompression bonding with a temperature-increase rate of 150° C./sec.

On the other hand, in the case of the melt viscosity gradient φ being 900 to 3,100 Pa*s/° C. as in Reference Examples 1 to 3, even with bonding conditions of a temperature-increase rate of 50 to 150° C./sec, voidless and favorable solder bonds could be realized.

3.2 Examples (Collective Bonding)

As described above, in the present examples, a pre-applied underfill film was prepared; subsequently, the underfill film was used in collectively bonding a plurality of top chips having solder-tipped electrodes to bottom chips having counter electrodes by using a gang bonding device, such as that illustrated in FIGS. 11 and 12, to prepare package bodies which were evaluated for voids, solder bonding properties, and fillets. The elastic modulus, minimum melt viscosity and melt viscosity gradient of the underfill film were measured, the package bodies were prepared, and chip displacement, voids, solder bonding, and fillets were evaluated in the following manner.

Elastic Modulus and Minimum Melt Viscosity Measurement and Melt Viscosity Gradient Calculation A rheometer (ARES, TA Instruments) was used to measure the elastic modulus, the minimum melt viscosity and the minimum melt viscosity attainment temperature of the samples of each of the underfill films under conditions of 5° C./min and 1 Hz. Then, the melt viscosity gradient from the minimum melt viscosity attainment temperature plus 10° C. to the minimum melt viscosity attainment temperature plus 20° C. was calculated.

Package Body Preparation

First, the underfill film was pasted using a press device under conditions of 50° C. and 0.5 MPa onto a wafer which was then diced to obtain top chips having the solder-tipped electrode.

The top chips had a size of 5×5 mm, a thickness of 200 μm, and cap-type bumps comprising Cu/SnAg. The bumps had a diameter of 50 pun, a height of 20 μm (SnAg 5 μm), and a pitch of 150 μm; the bump number was 592.

Moreover, the bottom chips had a size of 10×10 mm (separation block type 30×30 μm), a thickness of 200 μm, and pad-type bumps comprising Ni/Au. The bumps had a diameter of 50 μm, a height of 3 μm, and a pitch of 150 μm; the bump number was 592.

Next, nine of the top chips were mounted on the bottom chips using a flip-chip bonder under conditions of 80° C., 2 seconds, and 40 N.

Thereafter, using a gang bonding device as illustrated in FIG. 11 and FIG. 12 and as in the bonding conditions illustrated in FIG. 5, collective bonding was performed at a temperature-increase rate of 50° C./sec from the minimum melt viscosity attainment temperature of the underfill film to 250° C. Furthermore, the heat tool of the gang bonding device was lowered (with 40 N for 10 seconds) within the duration of temperature-increase from the minimum melt viscosity attainment temperature to 250° C. Moreover, by curing at 150° C. for 2 hours, a package body illustrated in FIG. 3 was obtained.

Chip Displacement Evaluation

Chip displacement occurring when the nine top chips were collectively bonded to the bottom chips was visually observed using an X-ray apparatus; cases of insubstantial chip displacement, this being 5 μm or less, were evaluated as "P" and cases in which greater chip displacement was observed were evaluated as "F."

Void Evaluation

The package bodies were observed using SAT (scanning acoustic tomography, ultrasound imaging device). Void areas in the package bodies were observed, cases of voids not being generated or generated voids being less than 100 μm in diameter were evaluated as "P" and those having voids with greater diameters were evaluated as "F." Generation of voids exceeding 100 μm generally increases the likelihood of adverse effects to long-term reliability.

Solder Bonding Evaluation

Samples of the package body were cut, and the cut surfaces were polished; then, an SEM (scanning electron microscope) was used to observe the state of solder between the top chip bumps and the bottom chip bumps. Cases of favorable conditions in which solder wetting led to 90% or more coverage of the bottom chip-side bump were evaluated as "P" and otherwise as "F" for inadequate solder wetting conditions.

Fillet Evaluation

Inter-chip spaces and chip ends were visually inspected and cases of fillet formation were evaluated as "F" and otherwise "P" for cases of fillet formation not occurring.

Example 1

A composition as in the resin composition described in Reference Example 1 was prepared. This composition was coated to release-treated PET (polyethylene terephthalate) using a bar coater and dried in an oven at 80° C. for 3 minutes to prepare an underfill film having a thickness of 18 μm (cover release-treated PET (25 μm)/underfill film (18 μm)/base release-treated PET (50 μm).

Melt viscosity curves of Example 1 are shown in FIG. 12. Evaluation results of the underfill film of Reference Example 1 are represented in Table 2. The elastic modulus of the underfill film was 2.5 GPa, the minimum melt viscosity was 1,490 Pa*s, and the minimum melt viscosity attainment temperature was 113° C. Additionally, the melt viscosity gradient φ from 123 to 133° C. was 3,100 Pa*s/° C. When each evaluation of the package body using the underfill film of Example 1 was performed, first, after chip mounting, chip displacement was evaluated as P. Furthermore, void evaluation of the package body prepared using the underfill film resulted in P, solder bonding evaluation resulted in P, and fillet evaluation resulted in P.

Example 2

A resin composition as in the resin composition described in Reference Example 2 was prepared. This composition was coated to release-treated PET (polyethylene terephthalate) using a bar coater and dried in an oven at 80° C. for 3 minutes to prepare an underfill film having a thickness of 18 μm (cover release-treated PET (25 μm)/underfill film (18 μm)/base release-treated PET (50 μm).

Melt viscosity curves of Example 2 are shown in FIG. 12. Evaluation results of the underfill film of Reference Example 2 are represented in Table 2. The elastic modulus of the underfill film was 2.5 GPa, the minimum melt viscosity was 1,330 Pa*s, and the minimum melt viscosity attainment temperature was 112° C. Additionally, the melt viscosity gradient φ from 122 to 132° C. was 1,700 Pa*s/° C. When each evaluation of the package body using the underfill film of Example 2 was performed, first, after chip mounting, chip displacement was evaluated as P. Furthermore, void evaluation of the package body prepared using the underfill film resulted in P, solder bonding evaluation resulted in P, and fillet evaluation resulted in P.

Example 3

A resin composition as in the resin composition described in Reference Example 3 was prepared. This composition was coated to release-treated PET (polyethylene terephthalate) using a bar coater and dried in an oven at 80° C. for 3 minutes to prepare an underfill film having a thickness of 18 μm (cover release-treated PET (25 μm)/underfill film (18 μm)/base release-treated PET (50 μm).

Melt viscosity curves of Example 3 are shown in FIG. 12. Evaluation results of the underfill film of Reference Example 3 are represented in Table 2. The elastic modulus of the underfill film was 2.5 GPa, the minimum melt viscosity was 1,390 Pa*s, and the minimum melt viscosity attainment temperature was 113° C. Additionally, the melt viscosity gradient φ from 123 to 133° C. was 900 Pa*s/° C. When each evaluation of the package body using the underfill film of Example 3 was performed, first, after chip mounting, chip displacement was evaluated as P. Furthermore, void evaluation of the package body prepared using the underfill film resulted in P, solder bonding evaluation resulted in P, and fillet evaluation resulted in F.

Comparative Example 1

A composition was prepared as in the resin composition of Reference Example 4. This composition was coated to release-treated PET (polyethylene terephthalate) using a bar coater and dried in an oven at 80° C. for 3 minutes to prepare an underfill film having a thickness of 18 μm (cover release-treated PET (25 μm)/underfill film (18 μm)/base release-treated PET (50 μm).

Melt viscosity curves of Comparative Example 1 are shown in FIG. 12. Evaluation results of the underfill film of Comparative Example 1 are represented in Table 2. The elastic modulus of the underfill film was 2.5 GPa, the minimum melt viscosity was 1,950 Pa*s, and the minimum melt viscosity attainment temperature was 113° C. Additionally, the melt viscosity gradient φ from 123 to 133° C. was 4,000 Pa*s/° C. When each evaluation of the package body using the underfill film of Comparative Example 1 was performed, first, after chip mounting, chip displacement was evaluated as P. Furthermore, void evaluation of the package body prepared using the underfill film resulted in P, solder bonding evaluation resulted in F, and fillet evaluation resulted in F.

Comparative Example 2

A resin composition was prepared as in the resin composition of Comparative Example 5. This resin composition was coated to release-treated PET (polyethylene terephthalate) using a bar coater and dried in an oven at 80° C. for 3 minutes to prepare an underfill film having a thickness of 18 μm (cover release-treated PET (25 μm)/underfill film (18 μm)/base release-treated PET (50 μm)).

Melt viscosity curves of Comparative Example 2 are shown in FIG. 12. Evaluation results of the underfill film of Comparative Example 2 are represented in Table 2. The elastic modulus of the underfill film was 2.5 GPa, the minimum melt viscosity was 1,300 Pa*s, and the minimum melt viscosity attainment temperature was 115° C. Additionally, the melt viscosity gradient φ from 125 to 135° C. was 400 Pa*s/° C. When each evaluation of the package body using the underfill film of Comparative Example 2 was performed, first, after chip mounting, chip displacement was evaluated as P. Furthermore, void evaluation of the package body prepared using the underfill film resulted in F, solder bonding evaluation resulted in P, and fillet evaluation resulted in F.

TABLE 2

| Type | Trade Name | Ex. 1 | Ex. 2 | Ex. 3 | Comp. 1 | Comp. 2 |
| --- | --- | --- | --- | --- | --- | --- |
| Film-Forming Resin | Teisan Resin SG-P3 (Nagase ChemteX Corporation) | 40 | 40 | 40 | 40 | 40 |
| Acrylic Resin | OGSOL EA-0200 (OSAKA ORGANIC CHEMICAL INDUSTRY LTD.) | 68 | 49 | 39 | 76 | 29 |
| Organic Peroxide | PERHEXA V (NOF CORPORATION) | 2 | 1 | 1 | 4 | 1 |
| Epoxy | JER1031S (Mitsubishi Chemical Corporation) | 20 | 30 | 45 | 13 | 40 |
| Acid Anhydride | RIKACED HNA-100 (New Japan Chemical Co. Ltd.) | 10 | 20 | 15 | 7 | 30 |

TABLE 2-continued

| Type | Trade Name | Ex. 1 | Ex. 2 | Ex. 3 | Comp. 1 | Comp. 2 |
|---|---|---|---|---|---|---|
| Curing Accelerator | U-CAT-5002 (San-Apro Co. Ltd.) | 1 | 1 | 1 | 1 | 1 |
| Filler | AEROSIL R202 (NIPPON AEROSIL CO. LTD.) | 15 | 15 | 15 | 15 | 15 |
| | Total | 156 | 156 | 156 | 156 | 156 |
| | Acrylic Ratio | 70 | 50 | 40 | 80 | 30 |
| | Epoxy Ratio | 30 | 50 | 60 | 20 | 70 |
| | Elastic Modulus [GPa] | 2.5 | 2.5 | 2.5 | 2.5 | 2.5 |
| | Minimum Melt Viscosity [Pa*s] | 1490 | 1330 | 1390 | 1950 | 1300 |
| | Minimum Melt Viscosity Attainment Temperature [° C.] | 113 | 112 | 113 | 113 | 115 |
| | Melt Viscosity Gradient φ [Pa*s/° C.] | 3100 | 1700 | 900 | 4000 | 400 |
| | Chip Displacement | P | P | P | P | P |
| | Voids | P | P | P | P | F |
| | Bonding | P | P | P | F | P |
| | Fillets | P | P | F | F | F |

In the case of using an underfill film having a melt viscosity gradient φ exceeding 3,100 Pa*s/° C. as in Comparative Example 1, although voidless mounting was possible, defects in solder bonds occurred. In the case of using an underfill film having a melt viscosity gradient φ falling short of 900 Pa*s/° C. as in Comparative Example 2, although solder bonds were favorable, voids were generated.

On the other hand, in the case of using an underfill film having a melt viscosity gradient φ of 900 to 3,100 Pa*s/° C. as in Examples 1 to 3, even in the case of collectively bonding a plurality of chips, voidless and favorable solder bonds could be realized. This is considered to be due to effects of temperature-increase temperature differences depending on chip position being reduced. Moreover, in the case of using an underfill film having a melt viscosity gradient φ of 1,700 to 3,100 Pa*s/° C. as in Examples 1 and 2, fillet formation could be suppressed.

REFERENCE SIGNS LIST

1 wafer, 2 underfill film, 3 jig, 4 blade, 10 semiconductor chip, 11 semiconductor, 12 electrode, 13 solder, 20 underfill film, 21 adhesive layer, 30 circuit substrate, 31 substrate material, 32 counter electrode, 41 bottom chip, 42 counter electrode, 50 stage, 60 heat tool

The invention claimed is:

1. A method for manufacturing a semiconductor device comprising:
   a mounting step of mounting a plurality of semiconductor chips having a solder-tipped electrode onto an electronic component having a counter electrode opposing the solder-tipped electrode via an underfill film; and
   a compression bonding step of collectively bonding the plurality of semiconductor chips to the electronic component via the underfill film at a temperature condition of 230 to 280° C.,
   wherein the underfill film comprises an epoxy resin, an epoxy curing agent, a (meth)acrylate resin, and an organic peroxide, the underfill film having a minimum melt viscosity of 1,000 to 2,000 Pa*s, a minimum melt viscosity attainment temperature of 125° C. or less, and a melt viscosity gradient of 900 to 3,100 Pa*s/° C. from a temperature 10° C. higher than a minimum melt viscosity attainment temperature to a temperature 10° C. higher than the temperature.

2. The method for manufacturing a semiconductor device according to claim 1, wherein the melt viscosity gradient is 1,700 to 3,100 Pa*s/° C.

3. The method for manufacturing a semiconductor device according to claim 2, wherein a ratio of total mass of the (meth)acrylate resin and the organic peroxide to total mass of the epoxy resin and the epoxy curing agent is 7:3 to 5:5.

4. The method for manufacturing a semiconductor device according to claim 3,
   wherein the epoxy resin is a glycidyl ether-type epoxy resin, and
   wherein the epoxy curing agent is an alicyclic acid anhydride.

5. The method of manufacturing a semiconductor device according to claim 3,
   wherein the (meth)acrylate resin is a fluorene-based acrylate, and
   wherein the organic peroxide is a peroxyketal.

6. The method for manufacturing a semiconductor device according to claim 2,
   wherein the epoxy resin is a glycidyl ether-type epoxy resin, and
   wherein the epoxy curing agent is an alicyclic acid anhydride.

7. The method of manufacturing a semiconductor device according to claim 2,
   wherein the (meth)acrylate resin is a fluorene-based acrylate, and
   wherein the organic peroxide is a peroxyketal.

8. The method for manufacturing a semiconductor device according to claim 1,
   wherein the epoxy resin is a glycidyl ether-type epoxy resin, and
   wherein the epoxy curing agent is an alicyclic acid anhydride.

9. The method of manufacturing a semiconductor device according to claim 8,
   wherein the (meth)acrylate resin is a fluorene-based acrylate, and
   wherein the organic peroxide is a peroxyketal.

10. The method of manufacturing a semiconductor device according to claim 1,
    wherein the (meth)acrylate resin is a fluorene-based acrylate, and
    wherein the organic peroxide is a peroxyketal.

11. An underfill film for collectively bonding a plurality of semiconductor chips to an electronic component comprising:

an epoxy resin, an epoxy curing agent, a (meth)acrylate resin, and an organic peroxide, the underfill film having a minimum melt viscosity of 1,000 to 2,000 Pa*s, a minimum melt viscosity attainment temperature of 125° C. or less, and a melt viscosity gradient of 900 to 3,100 Pa*s/° C. from a temperature 10° C. higher than a minimum melt viscosity attainment temperature to a temperature 10° C. higher than the temperature.

12. The underfill film according to claim 11, wherein the melt viscosity gradient is 1,700 to 3,100 Pa*s/° C.

13. The underfill film according to claim 12, wherein a ratio of total mass of the (meth)acrylate resin and the organic peroxide to total mass of the epoxy resin and the epoxy curing agent is 7:3 to 5:5.

14. The underfill film according to claim 13,
wherein the epoxy resin is a glycidyl ether-type epoxy resin, and
wherein the epoxy curing agent is an alicyclic acid anhydride.

15. The underfill film according to claim 13,
wherein the (meth)acrylate resin is a fluorene-based acrylate, and
wherein the organic peroxide is a peroxyketal.

16. The underfill film according to claim 12,
wherein the epoxy resin is a glycidyl ether-type epoxy resin, and
wherein the epoxy curing agent is an alicyclic acid anhydride.

17. The underfill film according to claim 12,
wherein the (meth)acrylate resin is a fluorene-based acrylate, and
wherein the organic peroxide is a peroxyketal.

18. The underfill film according to claim 11,
wherein the epoxy resin is a glycidyl ether-type epoxy resin, and
wherein the epoxy curing agent is an alicyclic acid anhydride.

19. The underfill film according to claim 18,
wherein the (meth)acrylate resin is a fluorene-based acrylate, and
wherein the organic peroxide is a peroxyketal.

20. The underfill film according to claim 11,
wherein the (meth)acrylate resin is a fluorene-based acrylate, and
wherein the organic peroxide is a peroxyketal.

* * * * *